(12) United States Patent
Park et al.

(10) Patent No.: US 9,772,390 B2
(45) Date of Patent: Sep. 26, 2017

(54) MAGNETIC RESONANCE IMAGING DEVICE AND METHOD FOR GENERATING IMAGE USING SAME

(71) Applicant: Korea University Research and Business Foundation, Seoul (KR)

(72) Inventors: Jaeseok Park, Seoul (KR); Hoonjae Lee, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 613 days.

(21) Appl. No.: 14/388,955

(22) PCT Filed: Mar. 29, 2013

(86) PCT No.: PCT/KR2013/002623
§ 371 (c)(1),
(2) Date: Feb. 6, 2015

(87) PCT Pub. No.: WO2013/147542
PCT Pub. Date: Oct. 3, 2013

(65) Prior Publication Data
US 2015/0137808 A1 May 21, 2015

(30) Foreign Application Priority Data
Mar. 29, 2012 (KR) .......... 10-2012-0032492

(51) Int. Cl.
*G01R 33/56* (2006.01)
*G01R 33/48* (2006.01)
(Continued)

(52) U.S. Cl.
CPC ..... *G01R 33/5608* (2013.01); *G01R 33/4818* (2013.01); *G01R 33/561* (2013.01);
(Continued)

(58) Field of Classification Search
CPC ............ G01R 33/5608; G01R 33/5602; G01R 33/4818; G01R 33/561; G01R 33/565; G01R 33/5607
See application file for complete search history.

(56) References Cited

U.S. PATENT DOCUMENTS

| 5,528,144 A | 6/1996 | Gullapalli |
| 2005/0020907 A1* | 1/2005 | Shankaranarayanan G01R 33/56375 600/415 |

(Continued)

FOREIGN PATENT DOCUMENTS

| JP | 08-266503 A | 10/1996 |
| JP | 2000-014659 A | 1/2000 |

OTHER PUBLICATIONS

International Search Report for PCT/KR2013/002623 dated Jun. 21, 2013.

*Primary Examiner* — G. M. Hyder
(74) *Attorney, Agent, or Firm* — Pearne & Gordon LLP

(57) ABSTRACT

The magnetic resonance imaging device in accordance with the example embodiments, the magnetic resonance imaging device has an advantage that it is capable of generating an image quickly having a high resolution while minimizing generation of artifacts by comprising a data processing unit configured to relocate, in a K-space, gradient echo data acquired during inversion time by an inversion pulse and spin echo data acquired after the lapse of the inversion time; and an image generating unit configured to generate a final image from the spin echo data and the gradient echo data, in order to generate a magnetic resonance image quickly using long inversion time by the inversion pulse.

12 Claims, 7 Drawing Sheets

(51) Int. Cl.
*G01R 33/561* (2006.01)
*G01R 33/565* (2006.01)

(52) U.S. Cl.
CPC ....... *G01R 33/5602* (2013.01); *G01R 33/565* (2013.01); *G01R 33/5607* (2013.01)

(56) References Cited

U.S. PATENT DOCUMENTS

2005/0215881 A1  9/2005  Zijl
2007/0238973 A1  10/2007  Krueger
2011/0181285 A1  7/2011  Greiser

* cited by examiner

FIG. 5
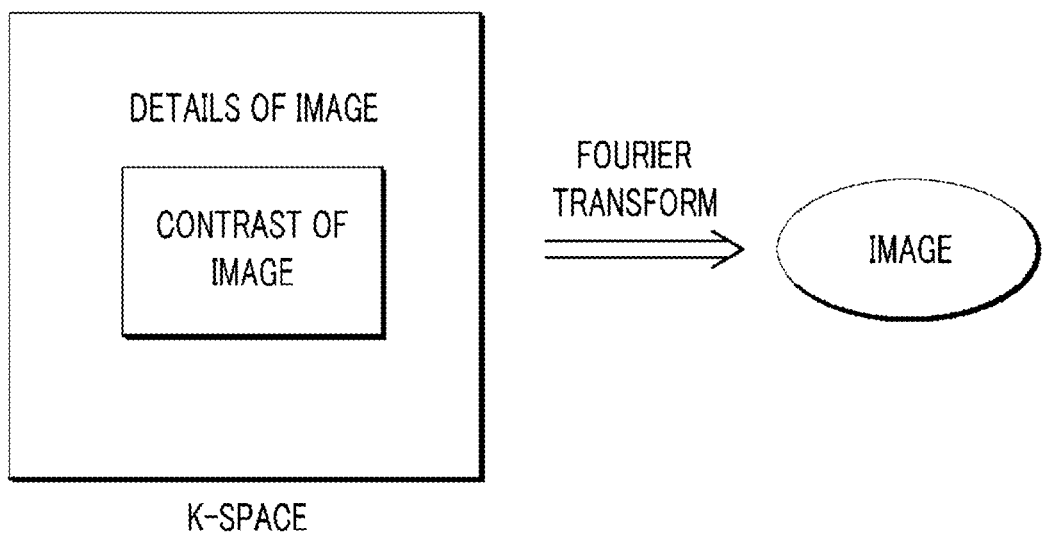
FIG. 6
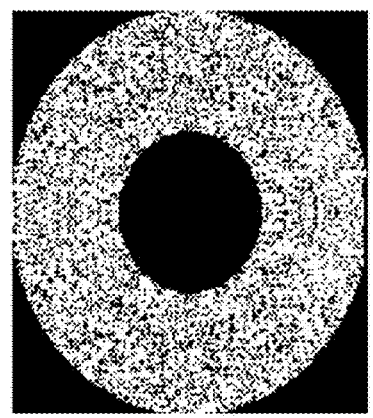
HIGH-FREQUENCY K-SPACE IN WHICH GRADIENT ECHO IS ENCODED
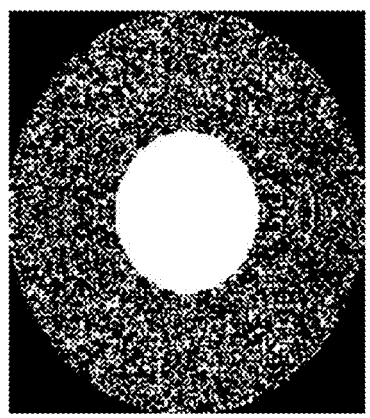
LOW-FREQUENCY AND HIGH-FREQUENCY K-SPACE IN WHICH SPIN ECHO IS ENCODED

MAGNETIC RESONANCE IMAGING DEVICE AND METHOD FOR GENERATING IMAGE USING SAME

CROSS-REFERENCE TO RELATED APPLICATION

This application claims the benefit of Korean Patent Application No. 10-2012-0032492 filed on Mar. 29, 2012 and PCT Application No. PCT/KR2013/002623 filed on Mar. 29, 2013, the disclosures of which are incorporated herein by reference.

TECHNICAL FIELD

The embodiments described herein pertain generally to a magnetic resonance imaging device and a method for generating an image by using the magnetic resonance imaging device.

BACKGROUND

Fluid-attenuated inversion recovery (FLAIR) is one of inversion recovery techniques. Particularly, FLAIR can be used in brain imaging to suppress cerebrospinal fluid effects on the image.

FIG. 1 is a diagram illustrating a T2-weighted image and a FLAIR image generated by the FLAIR technique. Both the T2-weighted image in the left side of the figure and the FLAIR image in the right side of the figure are generated by using long repetition time (TR) and long echo time (TE). Accordingly, except that a cerebrospinal fluid signal is suppressed and appears black on the FLAIR image, the white/gray contrasts of the two images are similar. By using the FLAIR image on which the cerebrospinal fluid signal is suppressed, it is possible to observe lesions accurately and diagnose a disease that emerges near a ventricle.

FIG. 2 is a diagram for describing a pulse sequence and T1 relaxation after the application of an inversion pulse of 180 degrees according to an inversion recovery technique applied to a magnetic resonance imaging device.

A pulse sequence of a spin echo image starts from an excitation pulse. In case of a pulse sequence according to the inversion recovery technique, however, an inversion pulse of 180 degrees is applied prior to an excitation pulse. Immediately after the inversion pulse of 180 degrees is applied, net magnetization of a biological tissue is completely inverted to a minus (−) direction of the longitudinal axis. Afterwards, T1 relaxation occurs according to characteristics of each tissue and magnetization in a plus (+) direction of the longitudinal axis starts to appear.

During this process, there is a time point when the net magnetization of the tissue in the direction of the longitudinal axis becomes zero (0). A time period from the time point when the inversion pulse of 180 degrees is applied to the time point when the net magnetization becomes zero (0) is referred to as inversion time (TI). By way of example, fat has inversion time of 150 ms; white matter, 300 ms to 400 ms; gray matter, 600 ms to 700 ms; and cerebrospinal fluid, 2000 ms to 2500 ms.

Thus, after the inversion pulse of 180 degrees is applied, an excitation pulse is applied after the lapse of time as much as the inversion time of a tissue intended to be suppressed. That is, if an excitation pulse is applied after the lapse of 2000 ms to 2500 ms after the inversion pulse of 180 degrees is applied, a FLAIR image on which cerebrospinal fluid signals are suppressed can be generated.

In the conventional FLAIR technique as mentioned above, flow signals are selectively eliminated by using the inversion time after the application of the inversion pulse. As the inversion time increases, however, the time required to acquire data also increases, raising a problem in using the technique clinically.

In this regard, U.S. Pat. No. 5,528,144 (entitled "Interleave slab inversion for weighted throughput in fluid attenuated inversion recovery imaging) discloses a technique of improving a processing speed by reducing data acquisition time through the use of a multi-slice technique when generating an image on which a cerebrospinal fluid signal is suppressed.

DISCLOSURE OF THE INVENTION

Problems to be Solved by the Invention

In view of the foregoing problems, example embodiments provide a magnetic resonance imaging device capable of improving data acquisition efficiency and thus capable of reducing the total imaging time by acquiring additional signals or data even during inversion time, and, also, provide a method for generating an image by using the magnetic resonance imaging device.

Further, the example embodiments also provide a magnetic resonance imaging device capable of generating an image having a high resolution while minimizing generation of artifacts by appropriately encoding data or signals additionally acquired during inversion time, and, also, provide a method for generating an image by using the magnetic resonance imaging device.

Means for Solving the Problems

In accordance with a first aspect (example embodiment) of the present disclosure, there is provided a magnetic resonance imaging device, comprising: a data processing unit configured to relocate, in a k-space, gradient echo data acquired during inversion time by an inversion pulse and spin echo data acquired after the lapse of the inversion time; and an image generating unit configured to generate a final image from the spin echo data and the gradient echo data.

Herein, the data processing unit may be configured to relocate the spin echo data near a center of the k-space, as compared to the gradient echo data.

Herein, the data processing unit may be configured to relocate, in the K-space, the gradient echo data and the spin echo data which are randomly sampled to reduce an energy level difference between the spin echo data and the gradient echo data.

Herein, the data processing unit may be configured to relocate, in the K-space, the spin echo data acquired by a VFL-TSE technique and the gradient echo data acquired by a PSIF technique in the K-space.

Preferably, the image generating unit may comprise a single unit configured to generate an image by combining the spin echo data and the gradient echo data in the K-space.

Preferably, the image generating unit may comprise: an image reconstructing unit configured to generate a first reconstructed image and a second reconstructed image from the spin echo data and the gradient echo data, respectively; and an image combining unit configured to generate the final image by combining the first reconstructed image and the second reconstructed image.

In accordance with a second aspect (another example embodiment) of the present disclosure, there is provided a method of generating a final image in a magnetic resonance imaging device, the method comprising: applying an inversion pulse; acquiring gradient echo data during inversion time by the inversion pulse; acquiring spin echo data after the lapse of the inversion time; relocating the spin echo data and the gradient echo data in a K-space; and generating the final image from the spin echo data and the gradient echo data.

Herein, in the process of acquiring the spin echo data, the spin echo data may be acquired by a VFL-TSE technique, and in the process of acquiring the gradient echo data, the gradient echo data may be acquired by a PSIF technique.

Herein, in the process of relocation, the spin echo data may be relocated near a center of the K-space, as compared to the gradient echo data.

Herein, in the process of relocation, the gradient echo data and the spin echo data, which are randomly sampled to reduce an energy level difference between the spin echo data and the gradient echo data, may be relocated in the K-space.

Preferably, the final image may be generated from the spin echo data and the gradient echo data combined in the K-space.

Preferably, the process of generating the final image may comprise: generating a first reconstructed image and a second reconstructed image from the spin echo data and the gradient echo data, respectively; and generating the final image by combining the first reconstructed image and the second reconstructed image.

Effect of the Invention

In accordance with the example embodiments, the magnetic resonance imaging device has an advantage in that it is capable of generating an image, from which in vivo fluid signals are selectively eliminated, at a higher speed by using gradient echo data acquired during inversion time by an inversion pulse and spin echo data acquired after the lapse of the inversion time.

Further, in accordance with the example embodiments, the magnetic resonance imaging device also has an advantage that it is capable of generating an image having a high resolution while minimizing generation of artifacts by using randomly sampled gradient echo data and spin echo data to reduce an energy level difference between the spin echo data and the gradient echo data.

Moreover, in accordance with the example embodiments, the method of generating an image by using the magnetic resonance imaging device has an advantage in that an image having a higher resolution than that of a FLAIR image of the prior art, in the same imaging time, is generated, thus enabling accurate and precise diagnosis of a disease and prediction of risk.

BRIEF DESCRIPTION OF THE DRAWINGS

FIG. 5 is a diagram for describing characteristics of a general K-space.

FIG. 6 is a diagram for describing K-spaces obtained from spin echo and gradient echo in the magnetic resonance imaging device in accordance with the example embodiment.

MODE FOR CARRYING OUT THE INVENTION

Figure 1:
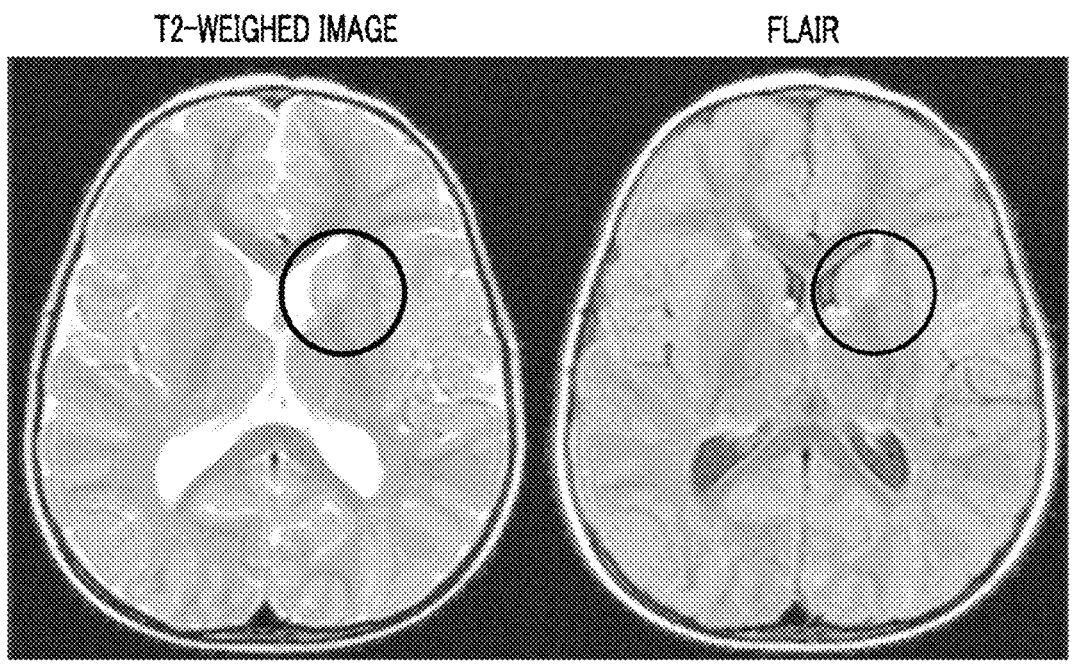
FIG. 1 provides a T2-weighted image and a FLAIR image.
Figure 2:
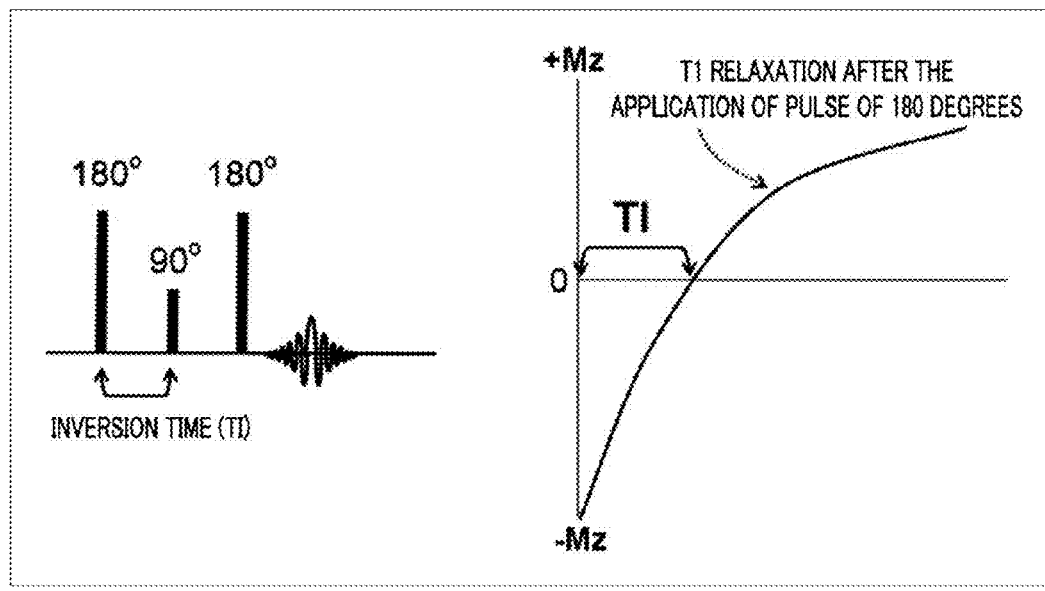
FIG. 2 is a diagram for describing a pulse sequence and T1 relaxation after the application of an inversion pulse of 180 degrees according to an inversion recovery technique applied to a magnetic resonance imaging device.

Hereinafter, example embodiments will be described in detail so that inventive concept may be readily implemented by those skilled in the art. However, it is to be noted that the present disclosure is not limited to the example embodiments and examples but can be realized in various other ways. In drawings, parts not directly relevant to the description are omitted to enhance the clarity of the drawings, and like reference numerals denote like parts through the whole document.

Through the whole document, the terms "connected to" or "coupled to" are used to designate a connection or coupling of one element to another element and include both a case where an element is "directly connected or coupled to" another element and a case where an element is "electronically connected or coupled to" another element via still another element.

Figure 3:
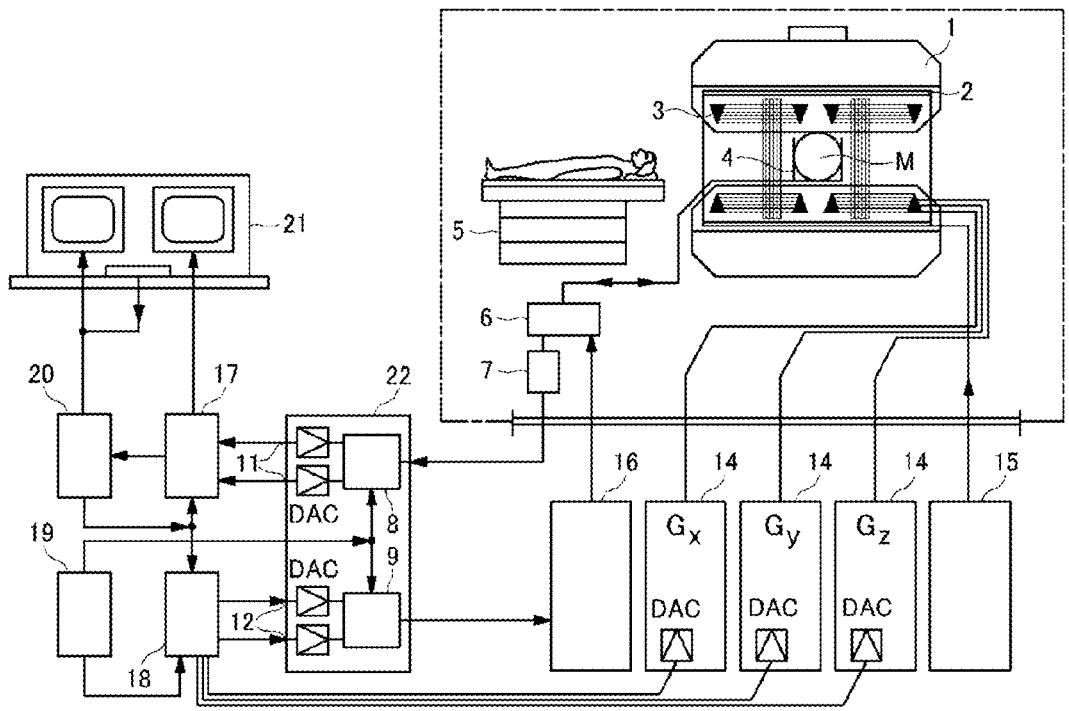
FIG. 3 is a block diagram illustrating an overall configuration of a magnetic resonance imaging device in accordance with an example embodiment.

FIG. 3 is a block diagram illustrating an overall configuration of a magnetic resonance imaging (MRI) device in accordance with an example embodiment. Here, a magnetic resonance imaging (MRI) device is an imaging equipment using a physical principle known as nuclear magnetic resonance (NMR). The MRI device has substantially the same structure as that of a conventional tomograph.

A main magnet 1 generates a strong magnetic field of a regular magnitude for polarizing or arranging nuclear spin within an inspection range f an object such as a human body part to be inspected. High homogeneity of the main magnet required for NMR measurement is defined within a spherical measurement space M. A human body part to be inspected is put into the measurement space M. At this time, to eliminate time-independent effects while meeting the requirement for the high homogeneity, a shim plate made of a so-called ferromagnetic material is provided at an appropriate position. The time-independent effects are eliminated by a shim coil 2 driven by a shim supply 15.

A cylindrical gradient coil system 3 made up of three partial windings is inserted into the main magnet 1. The respective partial windings are supplied with electric currents to generate linear gradient fields in individual directions of a parallel coordinates system by amplifiers 14. Here, the first partial winding of the gradient field system 3 generates a gradient Gx in X direction; the second partial winding, a gradient Gy in Y direction; and the third partial winding, a gradient Gz in a Z direction. Each amplifier 14 is equipped with a digital-analog converter, and the digital-analog converter is controlled by a sequence control system 18 to generate a gradient pulse exactly on time.

A high frequency antenna 4 is provided within the gradient field system 3. The high frequency antenna 4 converts a high frequency pulse emitted from a high frequency power amplifier 16 to an alternating field in order to excite a nucleus and arrange nuclear spin in an inspection target object or in an inspection target region of an object. A nuclear spin echo signal, which is generated by the alternating field emitted from the revolving nuclear spin, i.e., by a pulse sequence typically composed of one or more high frequency pulses and one or more gradient pulses, is converted to a voltage by the high frequency antenna 4. This voltage is supplied to a high frequency reception channel 8 of a high frequency system 22 by an amplifier 7.

Further, the high frequency system 22 also includes a transmission channel 9. A high frequency pulse for exciting nuclear magnetic resonance is generated within the transmission channel 9. In this case, an individual high frequency pulse is expressed as a series of complex numbers within a sequence control system 18 in a digital way by a pulse sequence previously set by an installation computer 20. Such a number string is supplied as a rear part and an imaginary part to the digital-analog converter coupled to the high frequency system 22 via respective input terminals 12 and then supplied to the transmission channel 9 from the digital-analog converter. At this time, the pulse sequence is modulated to a high frequency carrier signal within the transmission channel 9. A basic frequency of the high frequency carrier signal corresponds to a resonance frequency of nuclear spin within the measurement space.

Here, with regard to the connection between the gradient field system 3 and the high frequency system 22, switchover from a transmission operation by the transmission channel 9 to a reception operation by the high frequency reception channel 8 is accomplished by a duplexer 6.

The high frequency antenna 4 radiates a high frequency pulse for exciting nuclear spin into the measurement space M and samples echo signals that appear resultantly. Nuclear resonance signals obtained in correspondence thereto are encoded phase-sensitively within the reception channel 8 of the high frequency system 22 and converted to a real part and an imaginary part of a measurement signal by the individual analog-digital converters. An image processor 17 receives the signal data sent thereto via respective output terminals 11 and reconstructs the signal data into a single image.

Measurement data, image data and control programs are managed by the installation computer 20. Through presetting according to control programs, the sequence control system 18 controls generation of preset individual pulse sequences and sampling of a K-space corresponding thereto.

The sequence control system 18 controls gradient switching, emission of a high frequency pulse of a preset phase and a preset amplitude, and reception of a nuclear resonance signal. A synthesizer 19 provides a time base for the high frequency system 22 and the sequence control system 18. Selection of an appropriate control program for generating a nuclear spin image and a generated nuclear spin image are controlled by a terminal device 21 having a single keypad and one or more displays.

Figure 4:
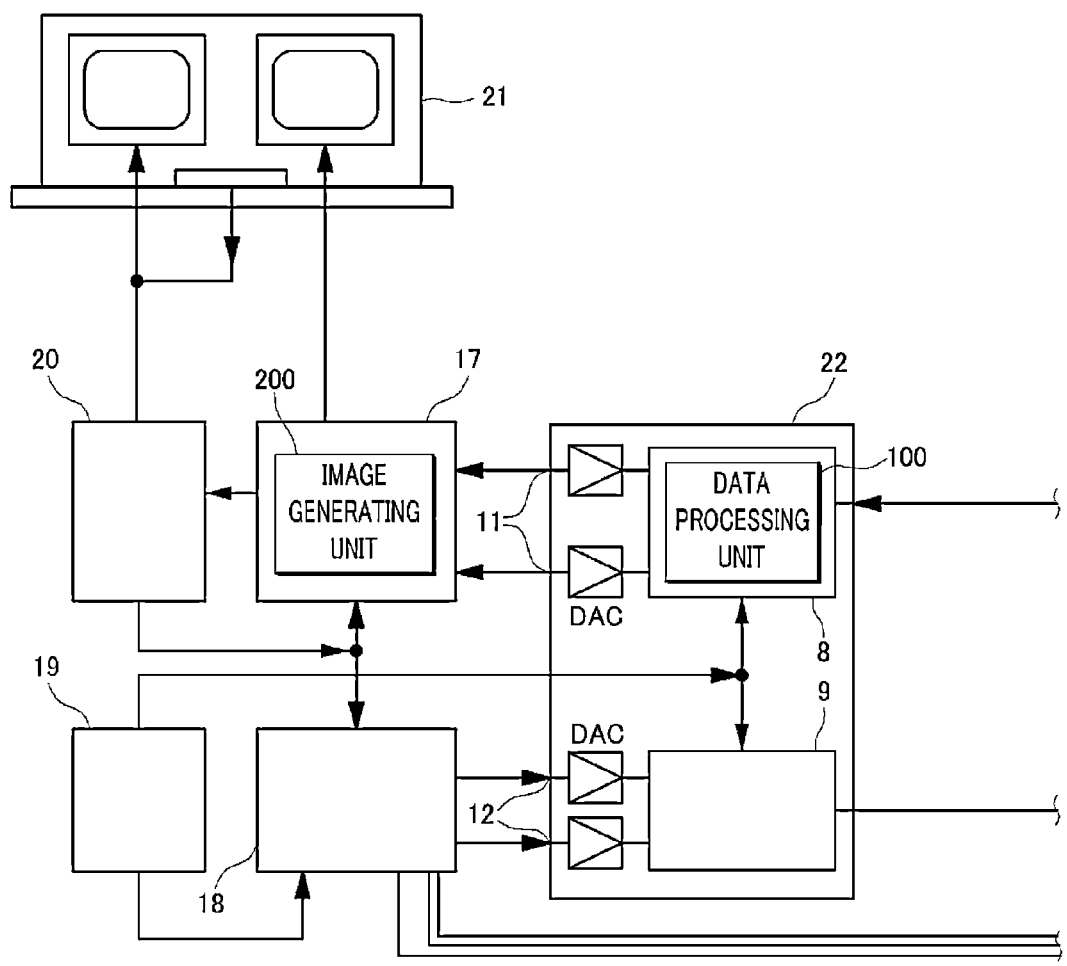
FIG. 4 is a block diagram that provides an enlarged view of a part of components shown in FIG. 3.

Below, referring to FIG. 4, a detailed configuration of the magnetic resonance imaging device in accordance with the example embodiment will be explained. FIG. 4 is a block diagram showing an enlarged view of some components shown in FIG. 3.

The magnetic resonance imaging device in accordance with the example embodiment includes a data processing unit 100 configured to relocate, in a K-space, gradient echo data obtained during inversion time by an inversion pulse and spin echo data obtained after the lapse of the inversion time; and an image generating unit 200 configured to generate an image from the spin echo data and the gradient echo data.

The data processing unit 100 is configured to process the spin echo data and the gradient echo data supplied to the high frequency reception channel 8 through the high frequency antenna 4 and relocate each data in the K-space. As depicted in FIG. 4, the data processing unit 100 can be provided within or coupled to the high frequency reception channel 8.

Here, acquiring gradient echo is a technique of maintaining T1 relaxation. The gradient echo data is acquired during the inversion time after the inversion pulse is applied. Spin echo is a signal affected by a magnetization state at the moment when an excitation pulsed is applied. A T2-weighted image can be generated by using the spin echo data acquired after the lapse of the inversion time.

With regard to relocation of respective data in a K-space performed by the data processing unit 100, technical features of the example embodiment will be described with reference to FIG. 5 and FIG. 6.

FIG. 5 is a diagram for describing characteristics of a general K-space, and FIG. 6 is a diagram for describing K-spaces obtained from spin echo and gradient echo in the magnetic resonance imaging device in accordance with the example embodiment.

The K-space shown in FIG. 5 may be a space in which data including number strings encoded to gray scale values are stored or relocated. Generally, data related to contrast and low frequency components of an image to be reconstructed may exist in the vicinity of the center of the K-space, and data related to details, resolution and high frequency components of the image to be reconstructed may exist in an outer region of the K-space. By performing Fourier transform on the date existing in the K-space, the image is generated.

At this time, the data processing unit 100 can process the data such that the spin echo data is relocated near the center of the K-space, as compared to the gradient echo data, as shown in FIG. 6. It is because the gradient echo data acquired by being encoded during the inversion time may correspond to information within a high frequency band, whereas the spin echo data acquired by being encode after the inversion time may correspond to information within a low frequency band.

Besides, the data processing unit 100 can improve the contrast and the resolution of an image to be generated by the image generating unit 200 to be described later by relocating spin echo data obtained by VFL-TSE (Variable FLip angle-Turbo Spin Echo) technique and gradient echo data obtained by PSIF (reversed Fast Imaging with Steady state free Precession; reversed FISP) technique in the K-space.

In addition, if the data processing unit 100 combines the spin echo data and the gradient echo data and the image generating unit 200 to be described below generates an image from the combined data, undesired artifacts may be generated within the image due to a difference in energy levels between the spin echo data and the gradient echo data. To suppress generation of the artifacts by reducing the energy level difference, the data processing unit 100 may perform random sampling of the spin echo data and the gradient echo data, and can relocate the spin echo data in the outer region of the K-space as well as in the vicinity of the center of the K-space.

Referring back to FIG. 4, the image generating unit 200 generates an image from the spin echo data and the gradient echo data that are provided to the image processor 17 from the above-described data processing unit 100 via the output terminals 11. At this time, the image generating unit 200 may be provided within or connected to the image processor 17, as illustrated in FIG. 4.

Figure 7:
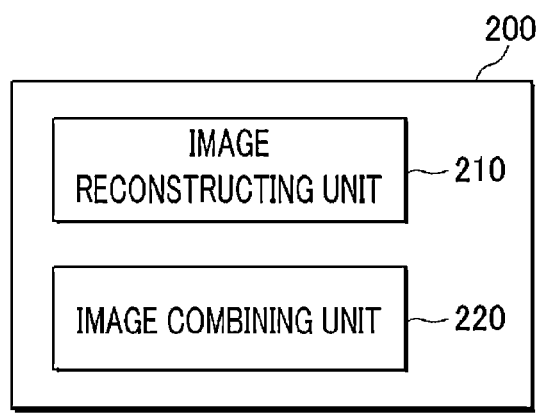
FIG. 7 is a block diagram illustrating a detailed configuration of an image generating unit of FIG. 4.

FIG. 7 is a block diagram illustrating a detailed configuration of the image generating unit of FIG. 4. The image generating unit 200 includes a single unit (not shown), an image reconstructing unit 210 and an image combining unit 220.

The single unit is configured to generate a final image by combining, in the K-space, the spin echo data and the gradient echo data supplied from the data processing unit 100. By performing Fourier transform in the state that the respective data are combined and relocated on the K-space, the single unit can generate the final image. This single unit can be selectively driven in relation to the image reconstructing unit 210 and the image combining unit 220 to be described below.

The image reconstructing unit 210 is configured to generate a first reconstructed image and a second reconstructed image from the spin echo data and the gradient echo data supplied from the data processing unit 100, respectively. The image reconstructing unit can generate the first and second reconstructed images by using a parallel imaging technique using information obtained from multi-coils or a compressed sensing technique of performing sparsity transform while using partial information.

At this time, the first reconstructed image generated from the spin echo data may have a relatively high contrast and a relatively low resolution, whereas the second reconstructed image generated from the gradient echo data may have a relative low contrast and a relatively high resolution.

The image combining unit 220 is configured to combine the first reconstructed image and the second reconstructed image generated by the image reconstructing unit 210. The image combining unit 220 generates the final image having a high contrast and a high resolution by supplementing the drawbacks of the first and second reconstructed images through optimum combination thereof.

Particularly, the image combining unit 220 may combine the first and second reconstructed images by applying a weight sum technique, and the generated final image may be a T2-weighted image from which in vivo fluid signals are selectively eliminated or suppressed.

In addition, the image reconstructing unit 210 and the image combining unit 220 may be selectively driven in relation to the single unit.

As stated above, the data processing unit of the magnetic resonance imaging device in accordance with the example embodiment is capable of generating, at a higher speed, an image from which in vivo fluid signals are selectively eliminated by processing the gradient echo data obtained during the inversion time by the inversion pulse and the spin echo data obtained after the lapse of the inversion time.

Now, a method of generating an image by using the above-described magnetic resonance imaging device in accordance with the embodiment will be described in further detail with reference to FIG. 8 to FIG. 10.

Figure 8:
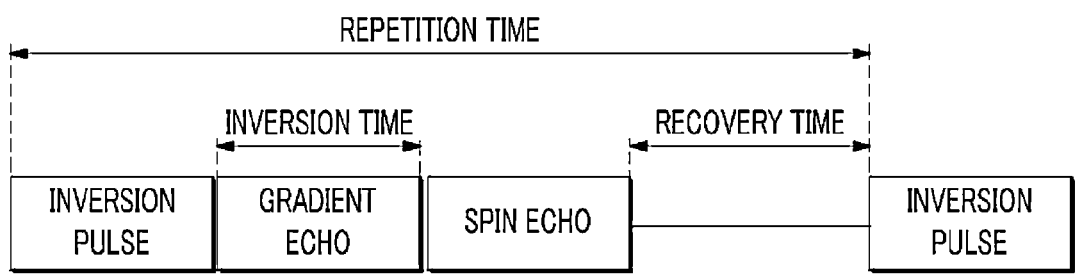
FIG. 8 is a diagram for describing a process of acquiring spin echo data and gradient echo data in a method of generating an image by using the magnetic resonance imaging device in accordance with the example embodiment.
Figure 9:
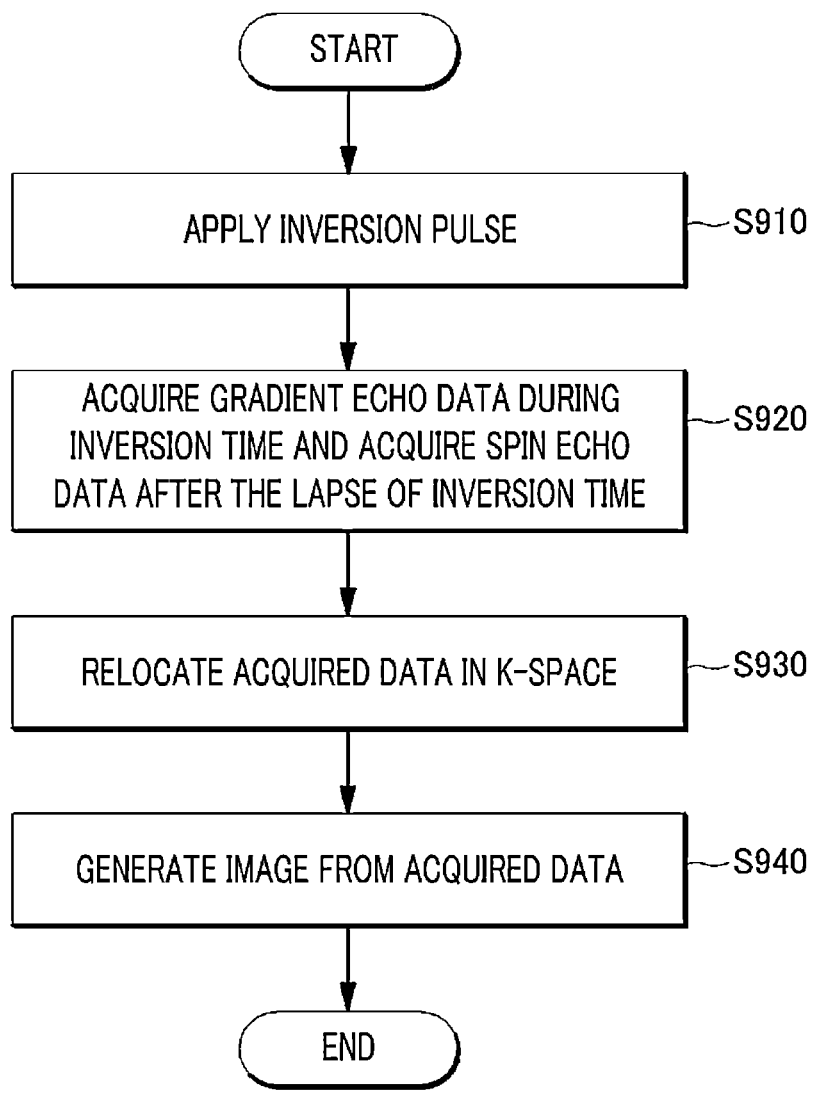
FIG. 9 is a flowchart for describing a method of generating an image by using the magnetic resonance imaging device in accordance with the example embodiment.

FIG. 8 is a diagram for describing a process of acquiring spin echo data and gradient echo data in the method of generating an image by using the magnetic resonance imaging device in accordance with the example embodiment. FIG. 9 is a flowchart for describing the method of generating an image by using the magnetic resonance imaging device in accordance with the example embodiment.

If the method of generating an image by using the magnetic resonance imaging device in accordance with the example embodiment is started, the magnetic resonance imaging device first applies an inversion pulse supplied from the transmission channel of the high frequency system to a biological tissue (S910).

The data processing unit acquires gradient echo data during inversion time induced by the applied inversion pulse and then acquires spin echo data after the lapse of the inversion time (S920). In other words, as the magnetic resonance imaging device applies an inversion pulse of 180 degrees, as depicted in FIG. 8, net magnetization of the biological tissue is oriented toward a minus (−) direction of the longitudinal axis, and the data processing unit acquires the gradient echo data until a time point when the net magnetization of the certain tissue in the direction of the longitudinal axis becomes zero (0) due to T1 relaxation. Then, after an excitation pulse is applied after the lapse of the inversion time of the certain tissue, the data processing unit acquires the spin echo data.

At this time, the inversion time can be applied on a regular cycle, and this is referred to as repetition time. The repetition time includes an inversion time, an imaging time, and a recovery time. Each of the gradient echo data and the spin echo data generated after the inversion pulse which is applied repeatedly during the repletion time can be acquired by the data processing unit.

Further, the spin echo data and the gradient echo data obtained by the data processing unit are relocated in the K-space (S930). In relocation, the data processing unit may relocate both data in the K-space such that a result suitable for the purpose of imaging can be generated.

The image generating unit generates a final image from the acquired spin echo data and gradient echo data (S940), and the process is terminated. At this time, in case that an excitation pulse is applied after the lapse of inversion time corresponding to the cerebrospinal fluid, a T2-weighted image (FLAIR image) on which a cerebrospinal fluid signal is suppressed can be generated as the final image.

Figure 10:
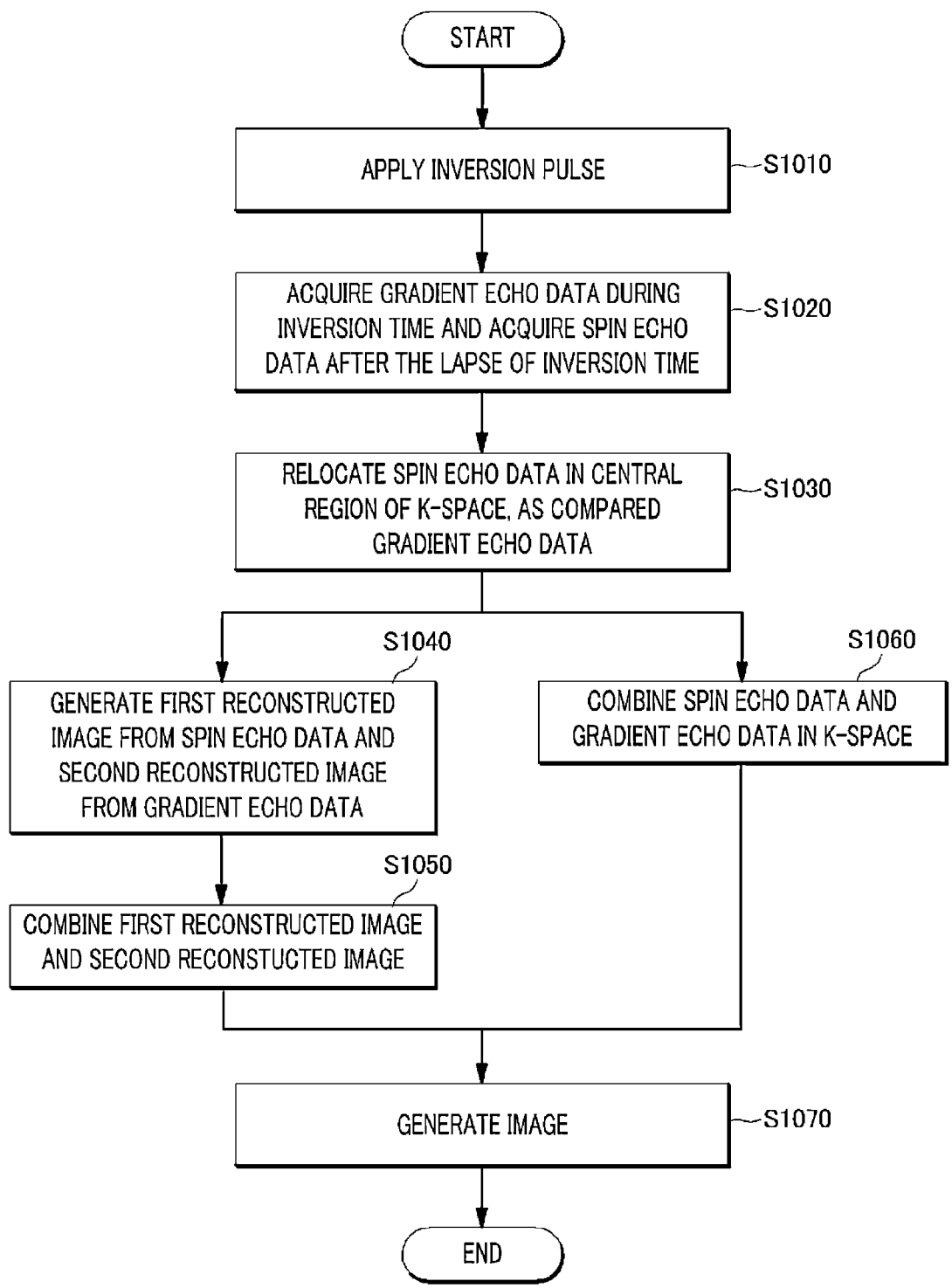
FIG. 10 is a flowchart for describing a method of generating an image by using a magnetic resonance imaging device in accordance with another example embodiment.

FIG. 10 is a flowchart for describing a method of generating an image by using a magnetic resonance imaging device in accordance with another example embodiment.

If the method of generating an image by using the magnetic resonance imaging device in accordance with another example embodiment is started, an inversion pulse supplied from a transmission channel of a high frequency system is applied to a biological tissue (S1010).

A data processing unit acquires gradient echo data during inversion time induced by the applied inversion pulse and then acquires spin echo data after the lapse of the inversion time (S1020).

Here, the spin echo data can be obtained by a VFL-TSE technique, and the gradient echo data can be obtained by a PSIF technique.

To elaborate, among various methods for acquiring spin echo data, a VFL-TSE technique can be employed in the example embodiment. This technique is for maintaining a state in which in vivo fluid signals are eliminated when encoding information in a low frequency band and generating a T2-weighted image having contrast from which brain lesions can be easily observed.

Further, as a method for acquiring gradient echo data, there are known spoiled-GRE (Gradient Echo), FISP (Fast Imaging with Steady-state Precession), PSIF (Reversed FISP), balanced-SSFP (Steady-State Free Precession), and so forth. In the present example embodiment, the PSIF technique is particularly utilized. This technique is for acquiring image data while concurrently maintaining magnetization recovery in the longitudinal direction of the in vivo spin system according to T1 relaxation during the inversion time. Especially, since the PSIF technique has a T2-weighting effect over a certain standard, it is possible to acquire gradient echo data by applying this technique along with the VFL-TSE technique at the time of acquiring the spin echo data.

Subsequently, the spin echo data and the gradient echo data obtained by the data processing unit are relocated in the K-space (S1030). At the time of relocation, the spin echo data is located near a center of the K-space, as compared to the gradient echo data.

This is because the gradient echo data acquired by being encoded during the inversion time may correspond to information within a high frequency band, whereas the spin echo data acquired by being encode after the inversion time may correspond to information within a low frequency band In addition, when relocating the spin echo data and the gradient echo data in the K-space, a difference in energy levels between the spin echo data and the gradient echo data can be a problem. The energy level difference is one of factors that cause formation of artifacts in a final image. Thus, in order to reduce this energy level difference, the spin echo data and the gradient data may be first randomly sampled, and the randomly sampled spin echo data and gradient echo data may be relocated n the K-space.

Now, a case where an image reconstructing unit and an image combining unit are operated as one process for producing the final image will be described.

The image reconstructing unit generates a first reconstructed image by using the spin echo data obtained by the data processing unit, and also generates a second reconstructed image by using the gradient echo data obtained by the data processing unit (S1040). At this time, the image reconstructing unit generates the first and second reconstructed images by performing Fourier transform on the data relocated in the K-space.

The image combining unit combines the first and second reconstructed images (S1050). That is, the image combining unit is capable of combining the first reconstructed image having a relatively high contrast and a relatively low resolution and the second reconstructed image having a relatively low contrast and a relatively high resolution.

By combining the first and second reconstructed images, the image combining generates a final image having a high contrast and a high resolution, which supplements the shortcomings of the first and second reconstructed images (S1070). Then, the process is terminated.

As another process for producing the final image, a case where a single unit is operated will be explained. The single unit combines the spin echo data and the gradient echo data obtained by the data processing unit in the K-space (S1060) and then performs Fourier transform on the combined data.

Accordingly, the single unit is capable of generating a final image having a high resolution at a higher speed, as compared to conventional cases (S1070). Then, the process is terminated.

At this time, in case that an excitation pulse is applied after the lapse of inversion time corresponding to the cerebrospinal fluid, a T2-weighted image (FLAIR image) on which a cerebrospinal fluid signal is suppressed can be generated as the final image. By applying an excitation pulse after the lapse of inversion time corresponding to a specific tissue depending on the purpose of using images, it is possible to easily generate a T2-weighted image on which a signal of that specific tissue is suppressed.

The method of generating an image by using the magnetic resonance imaging device in accordance with the example embodiment has advantages in that an image having a high contrast and a high resolution can be generated at a higher speed while minimizing generation of artifacts by using gradient echo data acquired during inversion time by an inversion pulse and spin echo data acquired after the lapse of that inversion time.

The above description of the example embodiments is provided for the purpose of illustration, and it would be understood by those skilled in the art that various changes and modifications may be made without changing technical conception and essential features of the example embodiments. Thus, it is clear that the above-described example embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

We claim:

1. A magnetic resonance imaging device, comprising:
a data processing unit configured to relocate, in a K-space, gradient echo data acquired during inversion time by an inversion pulse and spin echo data acquired after the lapse of the inversion time; and
an image generating unit configured to generate a final image from the spin echo data and the gradient echo data.

2. The magnetic resonance imaging device of claim 1, wherein the data processing unit relocates the spin echo data near a center of the K-space, as compared to the gradient echo data.

3. The magnetic resonance imaging device of claim 1, wherein the data processing unit relocates, in the K-space, the gradient echo data and the spin echo data which are randomly sampled to reduce an energy level difference between the spin echo data and the gradient echo data.

4. The magnetic resonance imaging device of claim 1, wherein the data processing unit relocates, in the K-space, the spin echo data acquired by a VFL-TSE technique and the gradient echo data acquired by a PSIF technique.

5. The magnetic resonance imaging device of claim 1, wherein the image generating unit comprises a single unit configured to generate an image by combining the spin echo data and the gradient echo data in the K-space.

6. The magnetic resonance imaging device of claim 1, wherein the image generating unit comprises:
an image reconstructing unit configured to generate a first reconstructed image and a second reconstructed image from the spin echo data and the gradient echo data, respectively; and
an image combining unit configured to generate the final image by combining the first reconstructed image and the second reconstructed image.

7. A method of generating a final image in a magnetic resonance imaging device, the method comprising:
applying an inversion pulse;
acquiring gradient echo data during inversion time by the inversion pulse;
acquiring spin echo data after the lapse of the inversion time;
relocating the spin echo data and the gradient echo data in a K-space; and
generating the final image from the spin echo data and the gradient echo data.

8. The method of claim 7,
wherein in the process of acquiring the spin echo data, the spin echo data is acquired by a VFL-TSE technique, and
in the process of acquiring the gradient echo data, the gradient echo data is acquired by a PSIF technique.

9. The method of claim 7,
wherein in the process of relocation, the spin echo data is relocated near a center of the K-space, as compared to the gradient echo data.

10. The method of claim 7,
wherein in the process of relocation, the gradient echo data and the spin echo data, which are randomly sampled to reduce an energy level difference between the spin echo data and the gradient echo data, are relocated in the K-space.

11. The method of claim 7,
wherein the final image is generated from the spin echo data and the gradient echo data combined in the K-space.

12. The method of claim 7,
wherein the process of generating the final image comprises:
generating a first reconstructed image and a second reconstructed image from the spin echo data and the gradient echo data, respectively; and
generating the final image by combining the first reconstructed image and the second reconstructed image.

* * * * *